United States Patent [19]

Hoehn

[11] Patent Number: 4,893,122

[45] Date of Patent: Jan. 9, 1990

[54] PARALLEL ANALOG TO DIGITAL CONVERTER EMPLOYING SAMPLE AND HOLD STAGES

[75] Inventor: Wolfgang Hoehn, Märgen, Fed. Rep. of Germany

[73] Assignee: Deutsche ITT Industries GmbH, Freiburg, Fed. Rep. of Germany

[21] Appl. No.: 276,258

[22] Filed: Nov. 25, 1988

[30] Foreign Application Priority Data

Dec. 15, 1987 [EP] European Pat. Off. ........ 87118603.7

[51] Int. Cl.$^4$ ............................................. H03M 1/36
[52] U.S. Cl. ................................... 341/122; 341/135; 341/141; 341/160
[58] Field of Search ............... 341/122, 123, 135, 141, 341/155, 159, 160, 161, 167

[56] References Cited

U.S. PATENT DOCUMENTS

| 4,147,943 | 4/1979 | Peterson | 307/355 |
|---|---|---|---|
| 4,190,823 | 2/1980 | Leichle | 341/141 |
| 4,599,602 | 7/1986 | Matzuzawa et al. | 341/161 |
| 4,649,372 | 3/1987 | Abe et al. | 341/141 |
| 4,677,422 | 6/1987 | Naito | 341/122 |
| 4,739,307 | 4/1988 | Marcovici et al. | 341/122 |

OTHER PUBLICATIONS

Electronic Design, Vo. 29, (1981), pp. 75-79, W. K. Bucklen: "Video Digitizing Gets Extra Bit of Resolution from Flash ADC".

Primary Examiner—William M. Shoop, Jr.
Assistant Examiner—Gary J. Romano
Attorney, Agent, or Firm—Thomas L. Peterson

[57] ABSTRACT

A parallel analog to digital converter and a method of processing at least two independnet signals therein are disclosed in accordance with the teachings of the present invention. The analog to digital converter has an improved sample and hold stage which, in addition to quantizing the analog signals, also multiplexes them. The sample and hold stage comprises at least two differential amplifier circuits, a latch stage, and a timing stage. Each differential amplifier circuit converts one analog input by comparing it to a reference voltage. The discrete output of the differential amplifier circuit is stored in the latch stage and outputted to an encoder. The timing circuit stage first selects one differential amplifier circuit to output its discrete signal, and then selects the latch stage to output its stored results. By sequencing through each differential amplifier circuit, the present invention effectively multiplexes the analog inputs.

12 Claims, 1 Drawing Sheet

PARALLEL ANALOG TO DIGITAL CONVERTER EMPLOYING SAMPLE AND HOLD STAGES

BACKGROUND

The present invention relates to a parallel analog to digital (A/D) converter and a method for processing at least two signals therein, and more particularly, to a sample and hold stage for a parallel A/D converter, and a method for multiplexing at least two analog signals and quantizing each analog input into a set of discrete outputs.

Parallel A/D converters are commonly used in conjunction with video signal processors such as digital television receivers and video recorders. In accordance with super-VHS standards, two signals, luminance and chrominance, must be stored and read off a video tape as separate analog signals. The analog signals must then be converted into digital data for use by the digital receiver. In the past, conversion of these two analog signals has been performed by either of two devices: two parallel A/D converters or a single parallel A/D converter with a multiplexer placed ahead of it. Each system has inherent problems: the dual parallel A/D converter is expensive due to the large number of components required; and the multiplexer/parallel A/D converter distorts the video signal due to its internal capacitance.

The main drawback with employing two parallel A/D converters lies with the high cost of each device. An analog signal is converted into a digital word first by quantizing the signal into discrete outputs, and then by encoding the discrete outputs into a digital word. For an n-bit word, $2^n-1$ sample and hold stages are required to quantize the signal. Each sample and hold stage comprises a comparator and a latch. Each additional bit increases the resolution of the output. Therefore, for each additional bit of increased resolution, the required number of comparators and latches doubles. For example, a single-bit parallel A/D converter contains just one comparator and one latch while a seven-bit parallel A/D converter contains $2^7-1$ comparators and as many latches. As the number of latches and comparators doubles, the chip area of a converter implemented as a monolithic integrated circuit increases accordingly The increased size also increases the cost of each A/D converter. Because one A/D converter is assigned to each input signal, doubling the number of analog inputs doubles the cost of A/D conversion A less expensive means for converting at least two analog signals is to multiplex the analog signals into a single A/D converter. This system also encounters problems: in extreme cases, when the multiplexer switches signals and the input of the A/D converter changes from the positive maximum value of one analog signal to the minimum value of the other analog signal, the charge of the capacitance of the analog input reverses For a seven-bit A/D converter, this input capacitance is somewhere on the order of ten picofarads. Because of the time constant formed by the input capacitance along with the input resistance of the A/D converter and the output resistance of the multiplexer, the signals are distorted. Because distortion increases as the frequency of components of the analog signal increases, the use of a multiplexer ahead of the A/D converter is practically impossible.

Therefore, it is a practical object of the present invention to provide an improved parallel A/D converter and a method for processing two analog signals therein, thereby eliminating the need for a multiplexer ahead of the A/D converter.

A further object of the present invention is to improve the sample and hold stage by multiplexing the analog signals therein such that a possible reversal of charge of the A/D converter's input capacitance is avoided, thereby eliminating distortions caused by the high frequency components of the analog signal.

An additional object of the present invention is to expand the sample and hold stage of a conventional parallel A/D converter such that only three transistors and one additional controlled current path are required for each additional analog input to be processed, thereby adding only a negligible amount of area to the total chip area of the A/D converter.

Another object of the present invention is to provide an A/D converter comprising a plurality of parallel-connected sample and hold stages wherein the additional sample and hold stages increase the resolution of the digital output.

Various other objects and advantages of the present invention shall become clear from the following detailed description of an exemplary embodiment thereof and the novel features will be particularly pointed out in conjunction with the claims appended hereto.

SUMMARY OF THE PRESENT INVENTION

In accordance with the teachings of the present invention, a parallel analog to digital converter and a method for processing at least two analog signals therein are disclosed, wherein the A/D converter has an improved sample and hold stage which, in addition to sampling and converting the analog signals, also multiplexes them. The sample and hold stage comprises at least two differential amplifier circuits, a latch stage, and a timing stage. Each differential amplifier circuit corresponds to one analog input and performs the analog to digital conversion by comparing its analog input to a reference voltage. The discrete output of the differential amplifier circuit is stored in the latch stage and outputted to an encoder. The timing circuit stage first selects one differential amplifier circuit to output its discrete signal, and then selects the latch stage to output its stored results. By sequencing through each differential amplifier circuit, the present invention effectively multiplexes the analog inputs, thereby eliminating the need for a multiplexer ahead of an A/D converter.

BRIEF DESCRIPTIONS OF THE DRAWINGS

The invention will be more clearly understood by reference to the following detailed description of an exemplary embodiment thereof in conjunction with the accompanying drawings in which:

FIG. 1 is a schematic diagram illustrating the first and last sample and hold stages of the preferred embodiment of a parallel A/D converter according to the present invention; and FIG. 2 is a timing diagram of the input waveforms necessary to perform parallel A/D conversion with the preferred embodiment of the present invention.

DETAILED DESCRIPTION OF FIGURES

Figure 1:
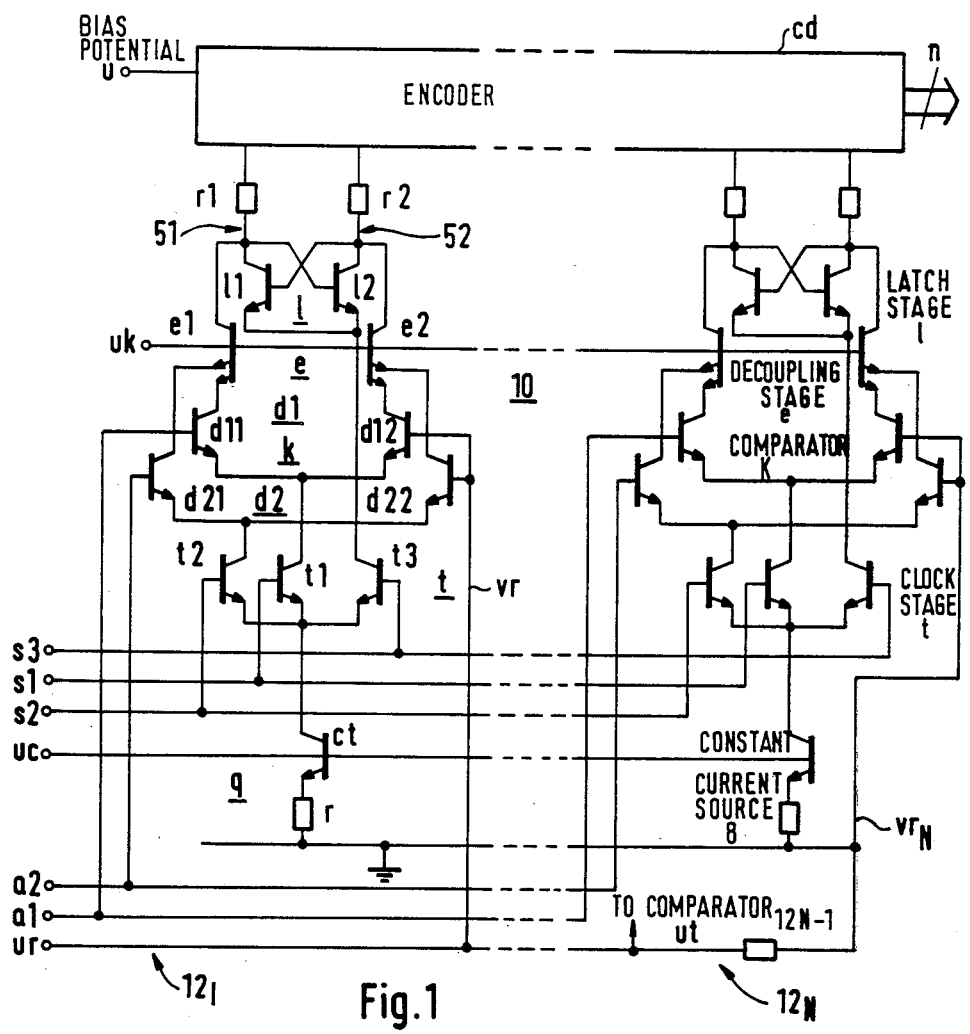

Referring to FIG. 1, there is shown a schematic diagram of the preferred embodiment of a parallel A/D converter 10 according to the present invention. The preferred embodiment processes two analog inputs and is implemented with npn-type bipolar transistors in a common-emitter configuration. The parallel A/D converter 10 comprises $2^n-1$ sample and hold stages $12_1 14$ $12_n$ (hereinafter referred to as quantizing stages) for quantizing the analog inputs, and an encoder cd for forming an n-bit word from the outputs of the quantizing stages $12_1$–$12_n$. In FIG. 1, only the first quantizing stage $12_1$ and the last quantizing stage $12_n$ are depicted. Each quantizing stage $12_1$–$12_n$ outputs two discrete signals: the first signal indicates that the analog input exceeds a reference voltage, and the second signal indicates that the reference voltage exceeds the analog input. The encoder cd, a common device which can be appreciated by those of ordinary skill in the art, is supplied with an input voltage on conductor u. This voltage on conductor u is a source of bias potential and is used to bias or operate each of the stages $12_1$–$12_n$. Each quantizing stage $12_1$–$12_n$ comprises a constant current source q, a clock stage t, a comparator stage k, a decoupling stage e, and a latch stage 1 The various stages are shown for both comparators $12_1$ and $12_n$. For the description that follows, reference will only be made to the first quantizing stage $12_1$.

The constant current source q consists of a transistor ct and a resistor r. The resistor r is connected between the emitter of the transistor ct and ground. The combination of transistor ct with resistor r forms a constant current source with a reference bias uc applied to the base electrode of transistor ct. Conductor uc connects the base of the transistor ct of the constant current source to a reference bias potential.

The clock stage t consists of a first transistor t1, a second transistor t2 and a third transistor t3. The respective emitters of the transistors t1, t2, t3 are connected together and to the collector electrode of the transistor ct of the constant current source. Conductors s1, s2, s3 are connected to the respective bases of the transistors t1, t2, t3. To the leads s1, s2 and s3 are applied suitable clock signals (FIG. 2) as f1, f2 and f3. As will be explained, the transistors t1, t2 and t3 are turned on and off by the clock signals s1, s2 and s3.

The comparator stage k consists of a first differential amplifier circuit d1 which responds to the first analog input and a second differential amplifier circuit d2 which responds to the second analog input. The first differential-amplifier circuit d1 comprises a first transistor d11 and a second transistor d12. The respective emitters of the transistors d11, d12 are connected together and to the collector of the transistor t1 of the clock circuit. Conductor a1 connects the base of the first transistor d11 to the first analog input. The second differential-amplifier circuit d2 comprises two additional transistors d21 and d22. The respective emitters of transistors d21, d22 are connected to the collector of the transistor t2 which receives the s2 clock at the base electrode. Conductor a2 connects the base of transistor d21 to the second analog input Reference voltage conductor ur connects the reference voltage to the respective bases of transistors d12 and d22. The reference voltage is obtained from a series resistor string and hence each comparator k in each stage ($12_1$ to $12_n$) receives a different reference level from the string as will be explained.

The decoupling stage e consists of first transistor e1 and a second transistor e2. The transistors e1, e2 each have two emitters with each emitter associated with a separate differential amplifier circuit as d1 or d2. The two emitters of the first transistor e1 connect to the respective collectors of transistors d11 and d21 in the differential amplifier circuits d1 and d2. The two emitters of the second transistor e2 connect to the respective collectors of transistors d12 and d22. Conductor uk connects the respective bases of transistors e1 and e2 to a reference level source.

The latch stage 1 consists of a first transistor 11 and a second transistor 12. The emitters of both transistors 11,12 connect to the collector of the transistor t3 which receives the clock signal s3. The collector of the transistor 11 of the latch is connected to the collector of the transistor e1 and to the base of the transistor 12, thereby forming junction J1. The collector of the transistor 12 of the latch is connected to the collector of transistor e2 of the decoupling stage and to the base of the transistor 11 of the latch, thereby forming junction J2. By connecting the transistors 11, 12 of the latch e in this manner, the cross-coupling commonly used for latches is obtained. It can be appreciated that the outputs of the latch at junctions J1 and J2 are the complements of each other.

A first load element or resistor r1 is connected between voltage supply conductor u and junction J1. A second load element r2 is connected between conductor u and junction J2. The first and second load elements r1, r2 can be passive or active resistive elements such as diffused resistors, bipolar constant-current transistors or MOS transistors and operates as load impedances for the circuit.

To fully realize the preferred embodiment of the present invention illustrated in FIG. 1, quantizer stages $12_1$–$12_n$ are connected in parallel. The load elements r1, r2 of each stage $12_1$–$12_n$ are connected to the voltage supply through conductor u. All input conductors s1, s2, s3, a1, a2, a3, uc, and uk are connected in parallel to the base of the associated transistor at each stage: conductor a1 is connected to the base electrode of transistor d11 in the first differential-amplification circuit d1; conductor a2 is connected to the base electrode of transistor d21 in the second differential-amplification circuit d2; conductors s1, s2, s3 are connected to the base electrodes of transistors t1, t2, t3 of the clock circuit t; conductor uk is connected to transistors e1, e2 of the decoupling stage e; and conductor uc is connected to the base electrode of transistor ct in the constant current source q.

As indicated, each quantizer stage $12_1$–$12_n$ has a different reference voltage. The reference voltages are generated by a voltage divider ut. The voltage divider for the next to last stage is shown in FIG. 1. The voltage divider has as many taps as comparators (counting the terminals for the reference voltage and ground); therefore, for $2^n-1$ quantizer stages, the voltage divider has $2^n-1$ resistive elements Conductor ur supplies the voltage divider ut with a reference voltage. Each conductor $ur_1$-$ur_n$ connects between one tap of the voltage divider ut and the bases of transistors d12, d22 to provide the reference level for the differential amplifier d1 and for the differential amplifier d2 in each quantizer stage.

Figure 2:
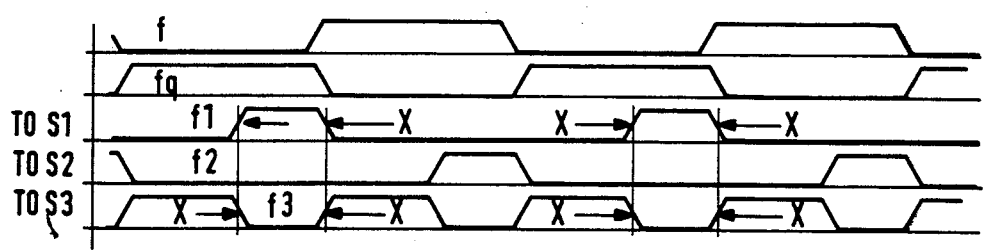

Referring now to FIG. 2, there is shown the timing diagram of the waveforms necessary to convert two analog signals to digital data using the preferred embodiment of the present invention. Waveforms f1, f2, f3 are non-overlapping signals having exact edge coincidence. The mark/space ratio of waveforms f3 is 1:1, and its frequency is twice the sampling frequency of waveforms f1 and f2 The pulses of waveform f1 coincide with the odd-numbered spaces between the pulses of waveform f3, while the pulses of waveform f2 coincide with the even-numbered spaces between the pulses of waveform f3.

Exact edge coincidence of the waveforms f1, f2, f3 is an essential requirement which will become apparent as the operation is described hereinafter The temporal interrelationship of waveforms f1, f2, f3 is marked by the interval X. Interval X ensures that sufficient time is available in the two differential-amplification circuits d1, d2 to form the sample value of the respective analog signal, and that the respective sample values are transferred into the latch stage 1 on each trailing edge of a given pulse in waveform f3.

Using suitable gating and clock means, waveforms f1, f2, f3 can be derived from input waveforms f and fq. Input waveform fq can be obtained by inverting input waveform f; the edge delay that results, however, must be corrected in order to obtain the exact edge coincidence of waveforms f1, f2 and f3. The clock and gating means which generate waveforms f1, f2, f3 can be appreciated by those of ordinary skill in the art. Waveforms f1, f2, and f3 are output over conductors s1, s2, and s3 respectively.

Referring now to FIGS. 1 and 2, the operation of the parallel A/D converter is controlled by the input clock waveforms f1, f2, f3 on conductors s1, s2, s3. Selecting a transistor t1, t2 or t3 in effect selects the differential amplification circuit d1 or d2 or the latch stage 1 to output the results of the comparison. More particularly, a pulse on conductor s1 selects the first analog signal to be compared, output and stored; a pulse on conductor s2 selects the second analog signal to be compared, output and stored; and a pulse on conductor s3 selects the latch to output its stored data. Typically, during each cycle, four pulses occur on the conductors in the following sequence: s1-s3-s2-s3. In the preferred embodiment, the four pulses are of equal duration. During the first pulse, the analog signal on conductor a1 is compared to the reference voltage by the first differential amplifier circuit d1, and the results are output to the encoder cd and stored in the latch stage 1; during the second pulse, the stored results of the first comparison are output by the latch stage 1; during the third pulse, the analog signal on conductor a2 is compared to the reference voltage by the second differential amplifier circuit d2, and the results are output to the encoder cd and stored in the latch stage 1; and during the fourth pulse, the stored results of the second comparison are output by the latch stage 1.

During the occurrence of a pulse on conductor s1, clock transistor t1 conducts, thereby providing a current-controlled path to ground through the constant current stage q. When the signal on conductor a1 is greater than reference voltage on conductor $ur_1$, the first transistor d11 of the first differential amplifier stage d1 conducts, thereby completing the current-controlled path u-r1-e1-d11-t1-ct-r-ground. This path occurs due to the low impedance collector to emitter path of a conducting n type transistor. As a result, junction J1 is grounded and junction J2 has a high potential via the voltage source on conductor u. This state indicates that analog signal on conductor a1 exceeds the reference voltage.

During the occurrence of a pulse on conductor s3, transistor t3 conducts or is turned ON and transistor t1 stops conducting or is turned OFF. The high input to the base of transistor 11 of the latch 1 from junction J2 causes transistor p1 to conduct, thereby completing the current-controlled path u-r1-11-t3-q-ground. The low input to the base of transistor 12 of the latch from junction J1 prevents transistor 12 from conducting. Therefore, as long as the input on conductor s3 is high, the potential at junction J2 remains high and the potential at junction J1 remains low, thereby indicating that analog signal on conductor a1 exceeds the reference voltage.

When the input on conductor s1 is high but the reference voltage exceeds that on conductor a1, the transistor d12 of the differential amplifier d1 conducts, thereby completing the current-controlled path u-r2-e2-d12-t1-ct-r-ground. As a result, a low potential develops at junction J2 and a high potential develops at junction J1. During the occurrence of a pulse on conductor s3, the potentials at junctions J1 and J2 are maintained by the latch stage 1. The high input to the base of transistor 12 from the high potential at junction J1 causes transistor 12 of the latch to conduct, thereby completing the current-controlled path u-r2-12-t3-q-ground. The low potential to the base of transistor 11 from junction J2 prevents transistor 11 of the latch from conducting. Therefore, as long as the input on conductor s3 is high, the high potential at junction J1 and the low potential at junction J2 are maintained, thereby indicating that the reference voltage exceeds the signal on conductor a1.

During the occurrence of a pulse on conductor s2, the path u-r1-e1-d21-t2-q-ground will be completed if the signal on conductor a2 exceeds the reference voltage, or the path u-r2-e2-d22-t2-q-ground will be completed if the reference voltage exceeds the signal on conductor a2. Following the former state, the path u-r1-11-t3-q̄-ground will be completed during a pulse on conductor s3; following the latter state, the path u-r2-12-t3-q-ground will be completed during a pulse on conductor s3.

An alternate embodiment of the present invention would employ insulated-gate field effect transistors IGFETS (MOS technology) instead of bipolar transistors. Here, the source-drain path replaces the collector-emitter path of the bipolar transistor, and the gate electrode would replace the base electrode. To implement MOS technology, each dual-emitter decoupling transistor would be replaced by two MOSFETS. It is understood that in lieu of NPN transistors one can employ PNP transistors with opposite polarity biasing and reference potentials.

Another embodiment of the present invention would multiplex and quantize more than two analog signals. For each additional analog input, an additional differential amplifier circuit and corresponding transistor in the clock circuit t would be added. Furthermore, the polar transistors e1 and e2 as employed in the decoupling circuit would require an additional emitter For MOS technology, an additional MOSFET would be employed Although the instant invention has been described in connection with a highly specific exemplary embodiment thereof, it will be understood that many variations and modifications can be made by those of ordinary skill in the art. Therefore, it is manifestly intended that this invention be only limited by the claims and the equivalents thereof.

What is claimed is:

1. A parallel analog to digital converter for processing at least two analog inputs, said converter having at least one quantizing means for quantizing the analog inputs into at least one discrete output, and an encoder means for converting the output of said at least one discrete output into digital data, each of said at least one quantizing means comprising:

comparator means having a common reference voltage and at least two differential amplifier circuits, the input side of each of said at least two differential amplifier circuits being connected to a corresponding analog input, and the reference side of both being connected to the common reference voltage, wherein each of said at least two differential amplifier circuits compares its associated analog input to the reference voltage and generates at least one discrete output therefrom;

latch means for storing the output of said comparator means, the outputs of each of said at least two differential amplifier circuits being connected in parallel to the input of said latch means; and timing circuit means for selecting one differential amplifier circuit to compare its analog input to the reference voltage, output its results to the encoder means and store the results in said latch means, and for selecting the latch means to output its stored results to the encoder means;

whereby said timing circuit means sequentially selects each of said at least two differential amplifier circuits, one at a time, first generating at least one discrete output to the encoder means, and then outputting the stored results of said latch means to the encoder means, thereby multiplexing and converting the at least two analog signals into a stream of continuous digital data.

2. The parallel analog to digital converter according to claim 1, further comprising a voltage divider means for providing said common reference voltage for said comparator means.

3. The parallel analog to digital converter according to claim 1, said comparator means further comprises a decoupling means for coupling the outputs of said at least two differential amplifier circuits to the input of said latch means.

4. The parallel analog to digital converter according to claim 3, further including a constant current source coupled to said timing circuit means and for providing a ground return for said timing circuit means.

5. The parallel analog to digital converter according to claim 4, further comprising a voltage supply, a first load element being connected to the voltage supply, and a second load element being connected to the voltage supply, said constant current source is a constant current transistor and a resistor, with the resistor being connected between one end of the current path of said constant current transistor and ground;

said timing circuit means are a single clock-latch transistor and at least two clock transistors, each clock transistor being associated with one analog input, one end of the current path of the clock-latch transistor and each clock transistor being connected at a junction which is grounded through said constant current source;

said decoupling means are first and second decoupling transistors, each decoupling transistor having at least two current paths, each current path corresponding to one differential amplifier circuit, the output of said first decoupling transistor connecting to the voltage supply through the first load element, the output of said second decoupling transistor connecting to the voltage supply through the second load element;

said latch means are first and second latch transistors, one end of the current path of said first and second latch transistors forming a junction which is grounded through the clock-latch transistor, the other end of the current path of the first latch transistor connecting to the voltage supply through the first load element the control terminal of said first latch transistor connecting to the voltage supply through the second load element, the other end of the current path of said second latch transistor connecting to the voltage supply through the second load element, and the control terminal of the second latch transistor connecting to the voltage supply through the first load element;

each of said at least two differential amplifier circuits is a first and a second differential transistor, one end of the current paths of the first and second differential transistors forming a junction which is grounded through the current path of the clock transistor corresponding to its analog input, the other end of the current path of said first differential transistor being connected to the voltage supply through said first decoupling transistor, and the other end of the current path of said second differential transistor being connected to the voltage supply through said second decoupling transistor.

6. A parallel analog to digital converter according to claim 5, wherein all the control inputs of said constant current transistors are coupled together, all control inputs of said clock-latch transistors are coupled together, all control inputs of the clock transistors corresponding to the same analog signal are coupled together, and all control inputs of the first differential transistors corresponding to the same analog input are coupled together.

7. The parallel analog to digital converter according to claim 1, said timing means further comprising a waveform generator for generating a latch signal for selecting the latch means and at least two clock signals, each for selecting a differential amplifier circuit, wherein said signal do not overlap and have exact-edge coincidence.

8. The parallel analog to digital converter according to claim 7, wherein the mark/space ratio of the latch signal is 1:1.

9. The parallel analog to digital converter according to claim 8, having two analog inputs and a first and second clock signal, wherein said first clock signal has the same frequency as that of said second clock signal, said latch signal has a frequency twice that of the first clock signal, the pulses of the first clock signal coincide with the odd-numbered spaces between the pulses of the latch signal, and the pulses of the second clock signal coincide with the even-numbered spaces between the pulses of the latch signal.

10. A sample and hold stage of an analog to digital converter having two analog inputs and comprising:

a voltage supply;

first and second load elements, one end of each element being coupled to the voltage supply;

first and second decoupling transistors, each decoupling transistor having at least two current-controlled paths, the common end of the current path of each decoupling transistor being connected to the first and second load elements respectively;

a timing circuit having a first clock transistor, a second clock transistor, a third clock transistor and a constant current source, the constant current source being connected to ground, and one end of each first, second and third clock transistor forming a junction which is grounded through said constant current source;

a comparator having a first differential-amplifier circuit and a second differential-amplifier circuit, the first differential amplifier circuit consisting of two first differential transistors, one end of the current controlled path of both first differential transistors forming a junction which is grounded through said first clock transistor, the other end of each first differential transistor being coupled to one of said at least two current-controlled paths of said first and second decoupling transistors respectively; and said differential amplifier circuit consisting of two second differential transistors, one end of the current controlled path of both second differential transistors forming a junction which is grounded through the second clock transistor, the other end of each second differential transistor being coupled to another of said at least two current-controlled paths of said first and second decoupling transistors respectively; and a latch stage having a first and second latch transistor, one end of each of said latch transistors forming a junction which is grounded through said third clock transistor, the other end of the current path of the first latch transistor being coupled to said first load element, the other end of the current path of the second latch transistor being coupled to said second load element, the control terminal of said first latch transistor being connected to the second load element, and the control terminal of said second latch transistor being connected to the first load element.

11. A combination parallel analog to digital converter according to claim 1 and a digital signal recorder having two analog inputs, luminance and chrominance, wherein the parallel analog to digital converter multiplexes the two analog signals, quantizes each signal into at least one discrete output, and encodes said at least one discrete output into digital data in accordance with super vhs-standards.

12. A method for converting at least two independent analog inputs into digital data using a parallel analog to digital converter having at least one quantizing means for converting an analog signal into a set of discrete outputs and an encoding means for converting the set of discrete outputs into digital data, each of said at least one quantizing means having a comparator means with a common reference voltage and at least two differential amplifier circuits, each of said at least two differential amplifier circuit being connected to a corresponding analog input, and both being connected to the common reference voltage, wherein each of said at least two differential amplifier circuits compares its associated analog input to the reference voltage and generates at least one discrete output therefrom, and a latch means for storing the output of said comparator means, comprising the steps of:

sequentially selecting one differential amplifier circuit, thereby comparing its associated analog input and generating at least one discrete output therefrom, storing said at least one discrete output in said latch means and outputting said at least one discrete output to the encoding means;

selecting the latch means for outputting the stored data to the encoding means; and encoding the discrete outputs into digital data through the encoding means;

whereby by sequencing through each differential amplifier circuit, said at least two analog inputs are multiplexed into a continuous stream of digital data.

* * * * *